(12) United States Patent
de Souza et al.

(10) Patent No.: US 8,431,476 B2
(45) Date of Patent: Apr. 30, 2013

(54) METHOD TO PREVENT SURFACE DECOMPOSITION OF III-V COMPOUND SEMICONDUCTORS

(75) Inventors: Joel P. de Souza, Putnam Valley, NY (US); Keith E. Fogel, Hopewell Junction, NY (US); Edward W. Kiewra, Verbank, NY (US); Steven J. Koester, Ossining, NY (US); Christopher C. Parks, Poughkeepsie, NY (US); Devendra K. Sadana, Pleasantville, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/570,980

(22) Filed: Aug. 9, 2012

(65) Prior Publication Data

US 2012/0309153 A1   Dec. 6, 2012

Related U.S. Application Data

(63) Continuation of application No. 12/272,129, filed on Nov. 17, 2008, now Pat. No. 8,273,649.

(51) Int. Cl.
*H01L 21/28* (2006.01)
*H01L 21/3205* (2006.01)

(52) U.S. Cl.
USPC .......................................... 438/604; 438/607

(58) Field of Classification Search .................. 257/104, 257/190, 288, 289, 502, 636; 438/604, 81, 438/393
See application file for complete search history.

(56) References Cited

U.S. PATENT DOCUMENTS

| | | | |
|---|---|---|---|
| 4,172,906 A | 10/1979 | Pancholy | |
| 4,448,633 A | 5/1984 | Shuskus | |
| 4,615,766 A | 10/1986 | Jackson et al. | |
| 5,086,321 A | 2/1992 | Batey et al. | |
| 5,314,833 A | 5/1994 | Lee et al. | |
| 6,017,791 A | 1/2000 | Wang et al. | |
| 6,030,453 A | 2/2000 | Passlack et al. | |
| 6,784,101 B1 | 8/2004 | Yu et al. | |
| 6,858,503 B1 | 2/2005 | Ngo et al. | |
| 2006/0060132 A1 | 3/2006 | Hata | |
| 2007/0161214 A1 | 7/2007 | Fompeyrine et al. | |

OTHER PUBLICATIONS

Molarius, J.M., et al., "Tantalum-based Encapsulants for Thermal Annealing of GaAs" Journal of the Electrochemical Society, Mar. 1997, pp. 834-837, vol. 138.

*Primary Examiner* — Kimberly Rizkallah
*Assistant Examiner* — Errol Fernandes
(74) *Attorney, Agent, or Firm* — Scully, Scott, Murphy & Presser, P.C.; Louis J. Percello, Esq.

(57) ABSTRACT

A method of preventing surface decomposition of a III-V compound semiconductor is provided. The method includes forming a silicon film having a thickness from 10 Å to 400 Å on a surface of an III-V compound semiconductor. After forming the silicon film onto the surface of the III-V compound semiconductor, a high performance semiconductor device including, for example, a MOSFET, can be formed on the capped/passivated III-V compound semiconductor. During the MOSFET fabrication, a high k dielectric can be formed on the capped/passivated III-V compound semiconductor and thereafter, activated source and drain regions can be formed into the III-V compound semiconductor.

20 Claims, 8 Drawing Sheets

METHOD TO PREVENT SURFACE DECOMPOSITION OF III-V COMPOUND SEMICONDUCTORS

CROSS REFERENCE TO RELATED APPLICATION

This application is a continuation of U.S. patent application Ser. No. 12/272,129, filed Nov. 17, 2008 the entire content and disclosure of which is incorporated herein by reference.

FIELD OF THE INVENTION

The present invention relates to a semiconductor structure and a method of fabricating the same. More particularly, the present invention relates to a semiconductor structure including a capped/passivated III-V compound semiconductor.

BACKGROUND OF THE INVENTION

Compound semiconductors are semiconductor compounds composed of elements from two or more different groups of the Periodic Table of Elements. For example, III-V (or 13-15) compound semiconductors are composed of elements from Group 13 (B, Al, Ga, In) and from Group 15 (N, P, As, Si, Bi) of the Periodic Table of Elements. The range of possible formulae is quite broad because these elements can form binary (two elements, e.g., GaAs), ternary (three elements, e.g., InGaAs) and quaternary (four elements, e.g., AlInGaP).

III-V compound semiconductors, as well as other classes of compound semiconductors, are receiving renewed attention for use as channel materials for advanced ultra large scale integration (ULSI) digital logic applications due to their high electron hole mobility relative to channel materials composed of silicon. Despite having higher channel mobility than conventional silicon based devices, it is known that Group V elements such as As evaporate from the surface of a III-V compound semiconductor upon high temperature annealing (greater than 800° C.), leaving surface defects including surface pitting in the III-V compound semiconductor.

There are no known inexpensive and robust manufacturing working solutions to prevent surface decomposition of III-V compound semiconductors during high temperature processing. Such processing is required to electrically activate ion implanted dopants within the III-V compound semiconductor and to improve dielectric properties of a gate dielectric layer that typically overlays the III-V compound semiconductor.

Additionally, preventing surface decomposition of III-V compound semiconductors is a pre-requisite to fabricate high performance semiconductor devices, such as, for example, metal oxide semiconductor field effect transistors (MOSFETs), in III-V compound semiconductors. Severe surface decomposition of III-V compound semiconductors during high temperature processing can cause surface pitting, and/or surface erosion of the gate dielectric that is located above the compound semiconductor. The decomposition of the III-V compound semiconductor leads to the degradation of the electrical characteristics of the compound semiconductor as well as the devices that are fabricated thereon.

SUMMARY OF THE INVENTION

The present invention provides a method to cap (i.e., passivate) III-V compound semiconductors which allows the use of subsequent high temperature processing without surface decomposition of the compound semiconductor. In particular, the present invention provides a thin film of silicon as a cap layer for a III-V compound semiconductor which prevents surface decomposition of the III-V compound semiconductor during subsequent high temperature processing. The silicon cap layer may be amorphous, polycrystalline or single crystalline. In one preferred embodiment, the silicon cap is an amorphous silicon layer.

More particular, the applicants have discovered a narrow cap film regime that prevents surface pitting during high temperature annealing of III-V compound semiconductor surfaces. Even more particularly, the applicants have discovered that a thinner silicon film (on the order of 10 Å to 400 Å) is more effective in maintaining surface integrity of GaAs than thicker silicon films (greater than 400 Å). Thick silicon films (greater than 400 Å) as well as silicon dioxide and silicon nitride cause severe surface pitting of III-V compound semiconductor surfaces. In addition to preventing surface pitting of the surface of an III-V compound semiconductor, the thin silicon caps were also found to be effective in the temperature range required for high electrical activation of implanted dopants, as well as that required for improving dielectric properties of high dielectric constant (k) dielectrics. By "high k" it is meant a dielectric material having a dielectric constant that is greater than the dielectric constant of silicon dioxide (i.e., k greater than 4.0, preferably greater than 7.0).

The term "III-V compound semiconductor" as used throughout the present application, denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of GaAs, InAs, InP, InGaAs, InAlAs, InAlAsSb, InAlAsP and InGaAsP.

In general terms, the present invention provides a method of fabricating a semiconductor structure in which surface decomposition of III-V semiconductor compounds is prevented. This aspect of the invention includes:

forming a structure including a silicon layer having a thickness from 10 Å to 400 Å on a surface of a III-V compound semiconductor; and subjecting the structure to an annealing process at a temperature of about 800° C. or greater.

In some embodiments of the present invention, a gate region including at least a high k dielectric and an overlying gate conductor is formed atop the silicon layer prior to annealing. In such embodiments, the anneal activates dopants that are implanted into the III-V compound semiconductor at the footprint of the gate region. The implanted dopants are introduced into the III-V compound semiconductor with the silicon layer completely present atop the III-V compound semiconductor. Subsequent spacer formation on the exposed sidewalls of the gate region, portions of the silicon layer that are not beneath either the spacer or the gate region are removed utilizing a selective removal process.

In yet other embodiments of the present invention, a gate region including a protected photoresist mask is formed atop a portion of the silicon layer prior to annealing. After forming the gate region including a protected photoresist mask, exposed portions of the silicon layer are selectively removed and thereafter the implantation of source/drain dopants within the exposed portion of the III-V compound semiconductor is performed. The annealing step is then performed to activate the dopants. After activating the dopants, a metal semiconductor alloy layer can be formed atop the exposed source and drain regions. The metal semiconductor alloy formation includes first removing the patterned photoresist mask and then performing a salicidation (i.e., self-aligned silicidation) or germanidation process. The salicidation/germanidation process includes forming either a Si-containing cap or a Ge-containing atop the activated source and drain regions. Next, a metal semiconductor alloy forming metal is formed, followed by a diffusion barrier. A one step or two step anneal is thereafter performed which causes reaction between the metal semiconductor alloy forming metal and the underlying layer of Si/Ge.

In addition to providing a method, the present invention also provides a semiconductor structure. The semiconductor structure of the invention includes:

a silicon layer having a thickness from 10 Å to 400 Å located on a surface of a III-V compound semiconductor, wherein the III-V compound semiconductor has a surface layer at the interface with the silicon layer that has no surface pitting caused by evaporation of the Group V element from the III-V compound semiconductor, a surface roughness of less than 240 nm and a root mean square roughness of less than 0.5 nm.

BRIEF DESCRIPTION OF THE DRAWINGS

FIG. 3A is a cross sectional micrograph of a structure including a 250 Å amorphous silicon layer formed atop a GaAs substrate after thermal annealing, FIG. 3B is a corresponding top down view showing the surface of the amorphous Si capped GaAs substrate of FIG. 3A, and FIG. 3C is the corresponding cross sectional view of the structure shown in FIG. 3A, after removing the amorphous silicon layer.

FIG. 4A is a cross sectional micrograph of a structure including a greater than 400 Å amorphous silicon layer formed atop a GaAs substrate after thermal annealing, FIG. 4B is a top down view showing the surface of the amorphous Si capped GaAs substrate of FIG. 4A, and FIG. 4C is the corresponding cross sectional view of the structure shown in FIG. 4A, after removing the amorphous silicon layer.

DETAILED DESCRIPTION OF THE INVENTION

Figure 1A:
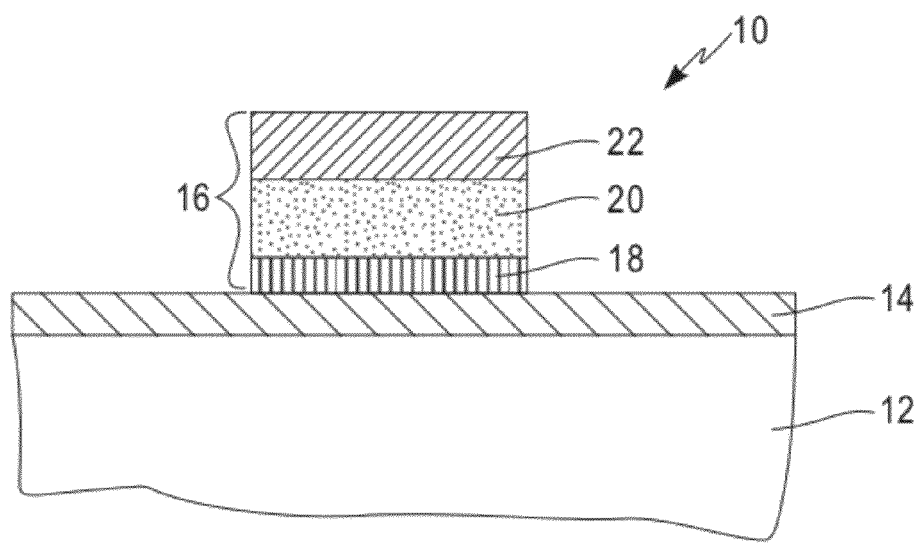
FIGS. 1A-1D are pictorial representations (through cross sectional views) illustrating a method in accordance with one embodiment of the present invention.

The present invention, which provides a method to cap/passivate III-V semiconductor compounds for high temperature processing without surface decomposition, will now be described in greater detail by referring to the following description and drawings that accompany the present application. It is noted that the drawings of the present application are provided for illustrative purposes only and, as such, the drawings are not drawn to scale. It is also noted that in the drawings like reference numerals are used in describing like materials.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As indicated above, the inventive method broadly includes forming a silicon film (i.e., silicon cap) having a thickness from 10 Å to 400 Å on a surface of a III-V compound semiconductor. The silicon film may be amorphous, polycrystalline or single crystalline, with amorphous silicon being highly preferred in some embodiments of the invention. After forming the silicon film onto the surface of the III-V compound semiconductor, a high performance semiconductor device including, for example, a MOSFET, can be formed on the capped/passivated III-V compound semiconductor. During the MOSFET fabrication a high k dielectric can be formed on the capped/passivated III-V compound semiconductor and thereafter, activated source and drain regions can be formed into the III-V compound semiconductor.

Due to the presence of the thin silicon cap, no surface decomposition of the III-V compound semiconductor is observed. Moreover, the presence of the thin silicon cap allows one to process the structure at high processing temperatures which leads to improved electrical properties, i.e., low leakage, of a gate dielectric layer that typically overlays the III-V compound semiconductor. That is, the inventive method provides a semiconductor structure that includes a silicon layer having a thickness from 10 Å to 400 Å on a surface of a III-V compound semiconductor, wherein the III-V compound semiconductor has a surface layer at the interface with the silicon layer that has no surface pitting caused by evaporation of the Group V element from the III-V compound semiconductor, a surface roughness of less than 250 nm, preferably less than 245 nm, more preferably less than 240 nm, and a root mean square roughness of less than 0.5 nm, preferably less than 0.45 nm, more preferably 0.4 nm or less.

Reference is now made to FIGS. 1A-1D which illustrate a method in accordance with one embodiment of the present invention. In particular, FIGS. 1A-1D illustrate a first embodiment of the invention which may be referred herein as a self-aligned/thru-cap ion implantation method. This embodiment of the invention begins by providing the structure 10 shown in FIG. 1A. The structure 10 shown in FIG. 1A includes a III-V compound semiconductor 12, a silicon layer 14 located on a surface of the III-V compound semiconductor 12, and at least one gate stack 16 located on a surface of the silicon layer 14. The gate stack 16 includes, from bottom to top, a high k dielectric 18, a gate conductor 20 and a hard mask 22.

Structure 10 is made by first providing the III-V compound semiconductor 12 as either a sole substrate or a layer that is formed atop another semiconductor substrate. When the III-V compound semiconductor is formed atop the other substrate, the other substrate comprises any semiconductor material including, but not limited to Si, SiGe, SiGeC, SiC, Ge alloys, GaSb, GaP, GaAs, InAs, InP, Ge and all other III-V compound semiconductors. The other substrate that may be located beneath the III-V compound semiconductor 12 may comprise a layered semiconductor material such as, for example, a semiconductor-on-insulator. The other substrate and/or the III-V compound semiconductor 12 may be doped, undoped or contain doped and undoped regions therein. The other semiconductor substrate or the III-V compound semiconductor 12 may have a single crystal orientation or it may have surface regions that have different crystal orientations. The other substrate and/or the III-V compound semiconductor 12 may be strained, unstrained or a combination thereof.

The III-V compound semiconductor 12 comprises a single crystal semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of GaAs, InAs, InP, InGaAs, InAlAs, InAlAsSb, InAlAsP and InGaAsP. In one embodiment of the invention, the III-V compound semiconductor 12 is a binary compound semiconductor, with GaAs being highly preferred in some embodiments.

As stated above, the III-V compound semiconductor 12 can be employed in the present invention as the sole substrate, or as a material layer that is formed atop another substrate. Notwithstanding whether the III-V compound semiconductor 12 is the sole substrate or a material layer formed atop another substrate, the III-V compound semiconductor 12 employed in the present invention is a single crystal material of typical commercial quality. By "typical commercial quality" it is meant that the III-V compound semiconductor 12 has a defect density on the order of about $10^5$ atoms/cm$^2$ or less, with a defect density of less than about 5000 atoms/cm$^2$ being more typical.

The typical commercial quality of III-V compound semiconductors is a result of utilizing an epitaxial growth process such as, for example, molecular beam epitaxy (MBE) or metalorgano chemical vapor deposition (MOCVD). That is, the III-V compound semiconductors are formed by an epitaxial growth process that produces a high quality, single crystal III-V substrate or film. The III-V compound semiconductor 12 can be epitaxially grown utilizing III/V-containing precursors that are well known to those skilled in the art. In some embodiments, a graded III-V compound semiconductor layer can be formed.

After providing the III-V compound semiconductor 12 (either as a sole substrate or as a material layer located atop other substrate), the III-V compound semiconductor 12 is typically, but not necessarily always, cleaned utilizing a conventional cleaning process such as, for example, 1) use of acetone to clean the substrate surface, 2) followed by isopropanol alcohol (IPA), 3) followed up with de-ionized water (DI water), 4) followed up with 9:1 HF:H$_2$O clean and DI water clean, that removes contaminates and/or surface oxides from the surface of the III-V compound semiconductor 12.

Next, the silicon layer 14 is formed on a surface of the III-V compound semiconductor 12. The silicon layer 14 may be amorphous, polycrystalline or single crystalline, with amorphous silicon being highly preferred for some embodiments of the invention. The silicon layer 14 is formed utilizing any conventional deposition process including, but not limited to plasma enhanced chemical vapor deposition (PECVD), chemical vapor deposition (CVD), atomic layer deposition (ALD), e-beam evaporation, and sputtering. The term "amorphous silicon" is used in the present invention denote that layer 14 is a silicon layer that lacks a well defined crystal structure.

The silicon layer 14 is used in the present as a capping/passivating layer for the underlying III-V compound semiconductor. Applicants have determined that a thin silicon layer 14 having a thickness from 10 Å to 400 Å, preferably from 50 Å to 390 Å, more preferably from 70 Å to 380 Å, and even more preferably 150 Å to 275 Å, is more effective in maintaining surface integrity of III-V compound semiconductors (e.g., avoids surface decomposition) than a silicon film whose thickness is outside the thickness range mentioned above. This is quite unexpected since thick silicon films would appear to be a better candidate for capping/passivation of III-V compound semiconductors than thinner silicon films.

Applicants have determined, in this regard, that thick silicon caps as well as caps comprised of silicon dioxide and silicon nitride do not provide sufficient surface passivation for III-V compound semiconductors. Applicants instead observe serve surface pitting when such thick caps were employed. Applicants have also determined that when the silicon layer 14 is within the thickness regime mentioned above the silicon layer was also effective in the temperature range required for high electrical activation of implanted dopants, as well as that required for improving the dielectric and/or electrical properties of a high k dielectric to be subsequently formed thereon.

Next, a high k dielectric 18 is formed on a surface of the silicon layer 14. The high k dielectric 18 employed in the present invention has a dielectric constant of greater than silicon dioxide, i.e., 4.0. All dielectric constants mentioned herein are relative to a vacuum unless otherwise stated. Typically, the high k dielectric 18 has a dielectric constant of about 7.0 or greater, with a dielectric constant of about 10.0 or greater being even more typical. Specifically, the high k dielectric 18 employed in the present invention includes, but is not limited to an oxide, nitride, oxynitride and/or silicate including metal silicates, aluminates, titanates and nitrides. In one embodiment, it is preferred that the high k dielectric 18 is comprised of HfO$_2$, ZrO$_2$, Al$_2$O$_3$, TiO$_2$, La$_2$O$_3$, SrTiO$_3$, LaAlO$_3$, Y$_2$O$_3$, a pervoskite oxide, HfSiO$_z$ (i.e., hafnium silicon oxide), HfAlO$_z$ (i.e., hafnium aluminum oxide) or HfAlO$_a$N$_b$ (i.e., hafnium aluminum nitride). In some preferred embodiments, the high k dielectric 18 is a Hf-based dielectric material.

The high k dielectric 18 is formed utilizing a conventional deposition process including, but not limited to molecular beam epitaxy (MBE), chemical vapor deposition (CVD), plasma enhanced chemical vapor deposition (PECVD), atomic layer deposition (ALD), evaporation, physical vapor deposition (PVD), chemical solution deposition and other like deposition processes.

The thickness of the high k dielectric 18 may vary depending on the deposition technique employed in fabricating the same as well as the composition and number of dielectrics of the high k dielectric. Typically, the high k dielectric 18 has a thickness from 0.5 to 20 nm, with a thickness from 1 to 10 nm being more typical.

After forming the high k dielectric 18, a gate conductor 20 is formed atop the high k dielectric 18. The gate conductor 20 includes at least one conductive material such as, for example, polysilicon, polysilicon germanium, conductive metals, conductive metal alloys, conductive silicides, conductive nitrides and combinations or multilayers thereof. When metallic-containing gate conductors are employed, the metallic gate conductor can be doped so as to shift the workfunction of the gate conductor. Illustrative examples of dopant ions include As, P, B, Sib, Bi, Al, Gab, Tl or mixtures thereof. The same dopants are also used with polysilicon or polySiGe mentioned above. Preferably, the gate conductor 20 is a conductive metal, with Al, Pt, Au, W and Ti being highly preferred. The selection of metal gates is advantageous since conductive metals have different workfunctions that permit one to adjust the threshold voltage of the device.

The gate conductor 20 is formed by a conventional deposition process such as, for example, CVD, PECVD, PVD, plating, thermal or ebeam evaporation and sputtering. The thickness of the gate conductor 20 may vary depending on the material of the gate conductor itself, as well as the processing technique used to form the same. Typically, the gate conductor 20 has a thickness form 50 to 200 nm, with a thickness from 100 to 150 nm being even more typical.

Next, an optional hard mask 22 is formed atop the surface of the gate conductor 20. The optional hard mask 20 is not used in some embodiments of the invention, particularly, in those embodiments in which gate conductor 20 is comprised of silicon or germanium. The optional hard mask 22 is comprised of an oxide, nitride or oxynitride, with oxides of silicon and/or nitrides of silicon being highly typical. The hard mask 22 is formed utilizing a conventional deposition process including, but not limited to CVD, PECVD, ALD, and chemical solution deposition. Alternatively, the hard mask 22 can be formed by a thermal oxidation and/or nitridation process.

The thickness of the hard mask 22 may vary depending on the material of the hard mask, as well as the processing technique used to form the same. Typically, the hard mask 22 has a thickness from 500 Å to 1000 Å, with a thickness from 100 Å to 500 Å being even more typical.

Following the formation of materials 14, 18, 20 and optionally 22 atop the III-V compound semiconductor 12, materials 18, 20 and, if present, 22, are patterned into at least one gate region (or stack) 16 by lithography and etching. The lithographic step includes applying a photoresist atop the optional hard mask 22, if present, or atop the gate conductor 20, if the hard mask 22 is not present, exposing the photoresist to a pattern of radiation and thereafter developing the exposed photoresist utilizing a conventional resist developer. The pattern within the developed photoresist is then transferred into the underlying material layers utilizing one or more etching steps, including dry etching and/or wet chemical etching. When dry etching is used to transfer the pattern into the underlying layers, one of reactive ion etching, ion bean etching, plasma etching and laser ablation can be used. When wet etching is used, a chemical etchant that selective removed layers 22, 20 and 18 is employed. The transfer of the pattern may first be into the hard mask, followed by resist removal and continued etching into layers 20 and 18. The etching stops atop the silicon layer 14 as shown, for example, in FIG. 1A. The resist is removed during or after the pattern transfer process by a conventional resist removal step such as, for example, ashing.

Figure 1B:
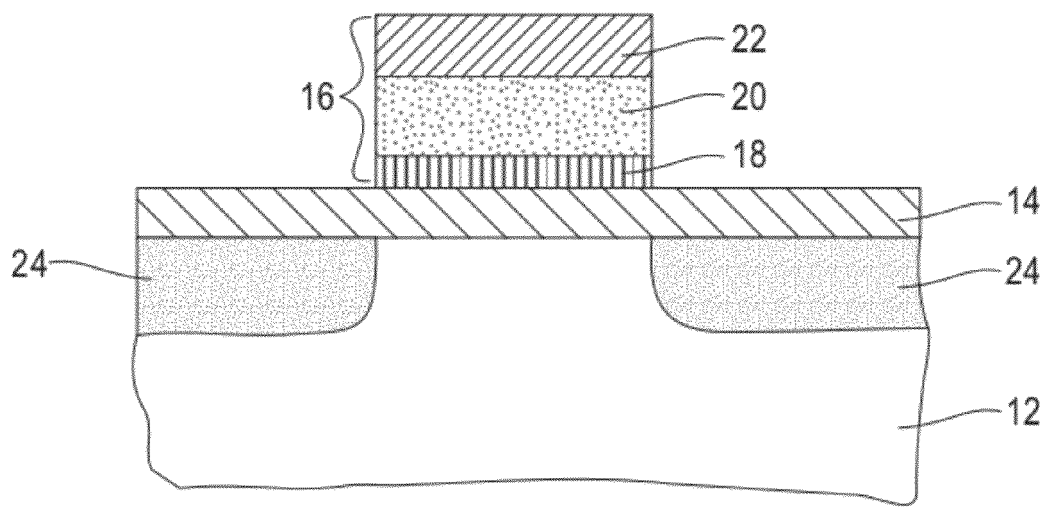

FIG. 1B shows the structure of FIG. 1A after forming source and drain regions 24 into the III-V compound semiconductor 12 at the footprint of the at least one gate region 16. The source and drain regions 24 are formed through portions of the silicon layer 14 that are not located beneath the at least one gate region 16. The source and drain regions 24 are formed by conventional ion implantation, followed by a thermal activation step. The thermal activation step is performed at a temperature of about 800° C. or higher, with an activation temperature of about 900° C. or higher being even more typical.

After forming the source and drain regions 24, at least one spacer 26 is formed on an exposed sidewall of the gate region 16. The resultant structure including the at least one spacer 26 is shown, for example, in FIG. 1C. The at least one spacer 26 is formed utilizing a conventional deposition process, followed by etching. The at least one spacer 26 may be comprised of an oxide, a nitride and/or an oxynitride. Typically, oxides of silicon and/or nitrides of silicon are used as spacer materials.

Figure 1C:
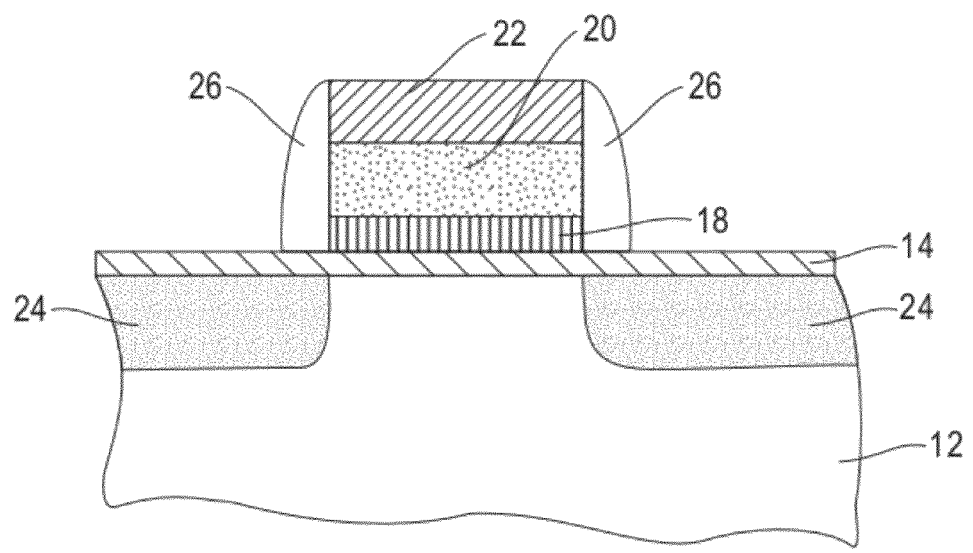
Figure 1D:
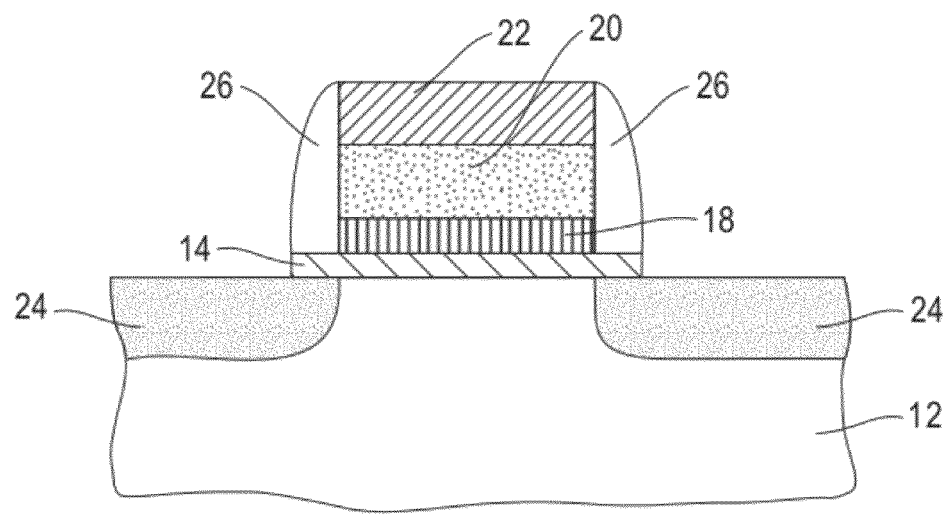

FIG. 1D illustrates the structure of FIG. 1C after removing the portions of the silicon layer 14 that are not located directly beneath the at least one spacer 26 and the gate region 16. The portions of the silicon layer 14 that are exposed, i.e., not covered by either the at least one spacer 26 or the gate region 16, are removed utilizing a chemical etchant that selectively removes silicon. One such chemical etchant that selectively removes silicon is 100:1 potassium hydroxide (KOH) at 68° C.-75° C. It is observed that this step of the invention is optional and need not performed in all instances.

At this point of the inventive process, further CMOS processing such as, for example, semiconductor metal alloy contact formation, and interconnect formation can be performed utilizing conventional techniques well known to those skilled in the art.

Reference is now made to FIGS. 2A-2H which illustrate a method in accordance with another embodiment of the present invention. In particular, FIGS. 2A-2H illustrate a second embodiment of the invention which may be referred to herein as a self-aligned/direct ion implantation/Si or Ge capped annealing method. The second embodiment of the invention begins by first providing the structure illustrated in FIG. 1A of the first embodiment. After that structure is formed, a block photoresist mask 50 is formed providing the structure shown in FIG. 2A. The block photoresist mask 50 is formed utilizing a conventional deposition process including, for example, spin-on coating, dip coating, chemical solution deposition, evaporation, CVD, and PECVD.

Figure 2A:
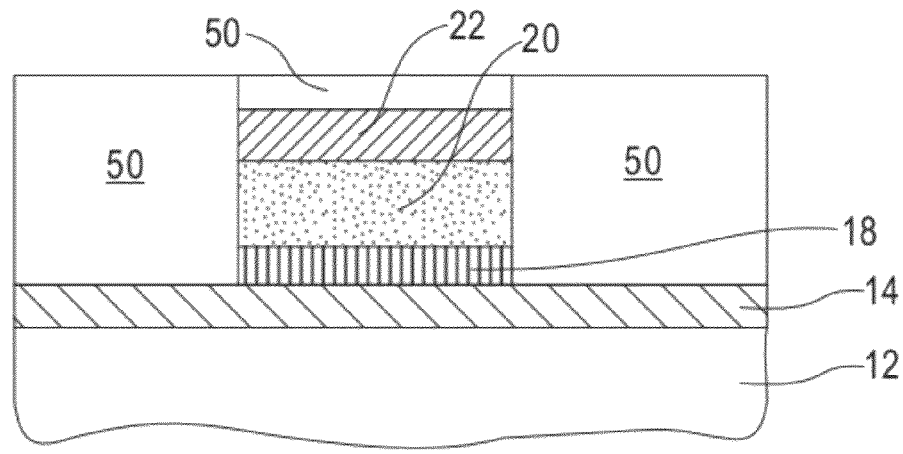
FIGS. 2A-2H are pictorial representations (through cross sectional views) illustrating a method in accordance with another embodiment of the present invention.
Figure 2B:
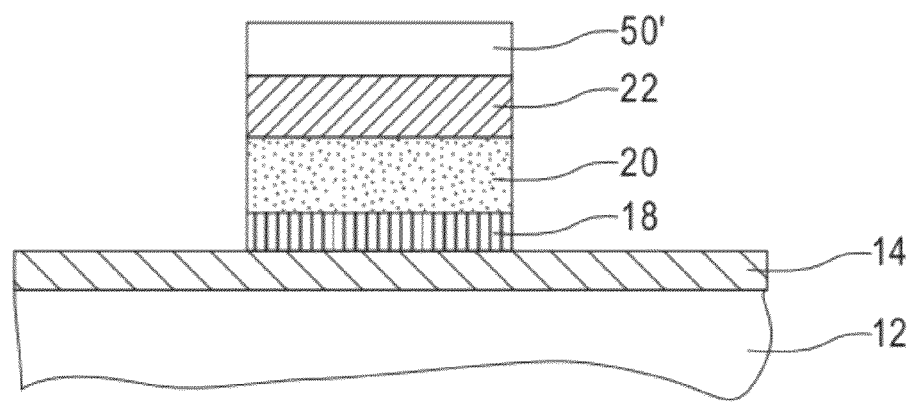

Next, and as shown in FIG. 2B, the block photoresist mask 50 is subjected to block lithography which forms a block photoresist mask 50' selectively atop the optional hard mask 22, if present, or atop the gate conductor 20, if the optional hard mask 22 is not present.

Figure 2C:
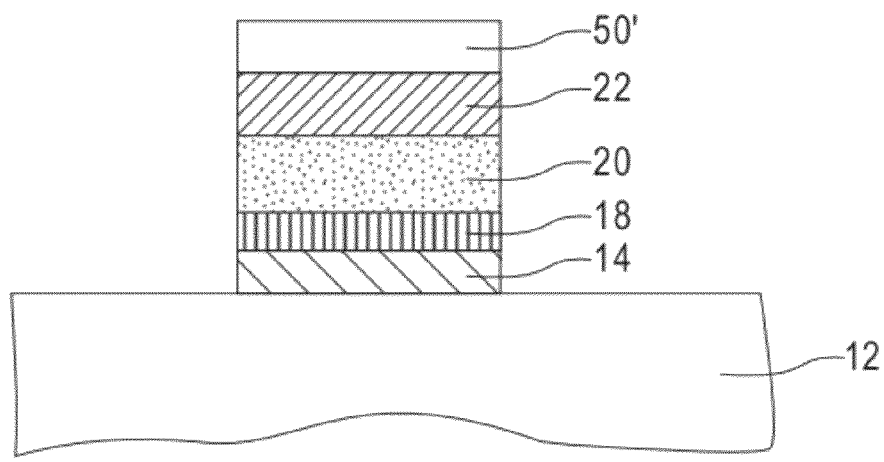

FIG. 2C illustrates the structure of FIG. 2B after the exposed portions of the silicon layer 14 which are not located directly beneath the gate region 16 that is protected by the block photoresist mask 50' are removed. The portions of the silicon layer 14 that are exposed, i.e., not covered by the bock mask protected gate region, are removed utilizing a chemical etchant that selectively removes silicon. One such chemical etchant that selectively removes silicon is 100:1 KOH at 68° C.-75° C.

Figure 2D:
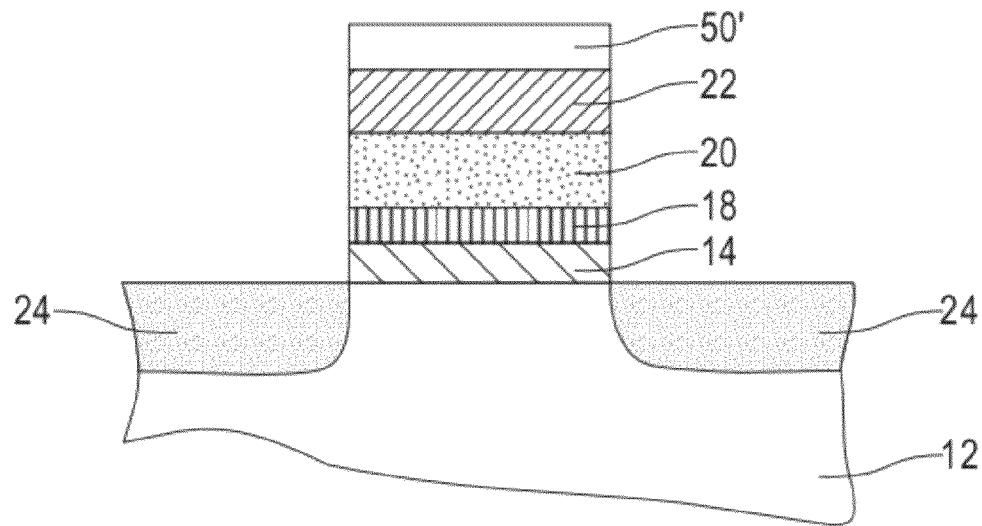

FIG. 2D illustrates the structure of FIG. 2C after forming source and drain regions 24 into the III-V compound semiconductor 12 at the foot print of the at least one gate region 16. In this embodiment of the invention, the ion implantation of source/drain dopants occurs directly through the III-V compound semiconductor 12. The source and drain regions 26 are formed by conventional ion implantation.

Next, the block mask photoresist 50' that protected the gate region 16 during removal of the exposed portions of the silicon layer 14 as well as during the formation of the source and drain regions 24 are then removed utilizing a resist stripping process such as, for example, ashing. Following the resist removal step, the exposed surfaces of the III-V compound semiconductor 12 are subjected to a cleaning process that removes contaminates and/or oxides from the surface of the III-V compound semiconductor 12. The cleaning process includes any process that is capable of removing contaminates and/or oxides from the surface of the III-V compound semiconductor 12. The resultant structure that is formed after resist removal and cleaning is shown, for example, in FIG. 2E.

Figure 2E:
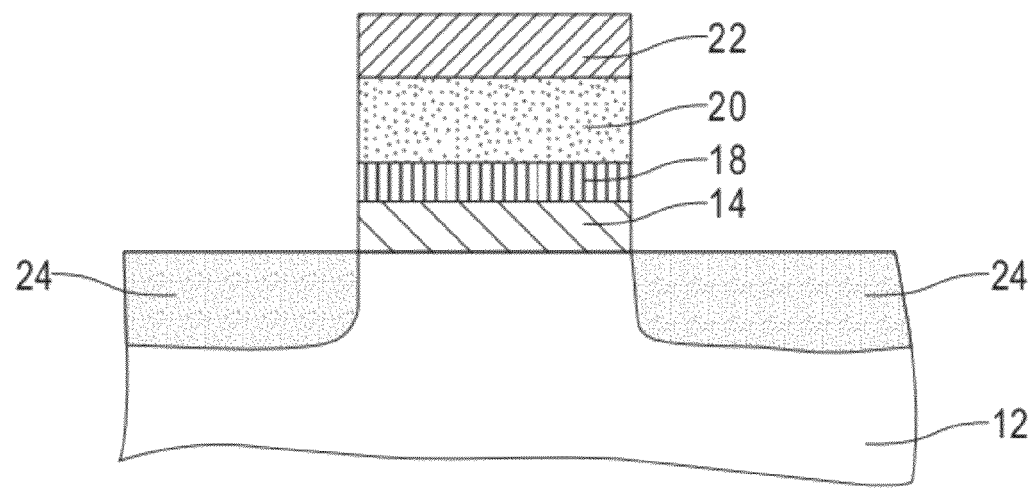
Figure 2F:
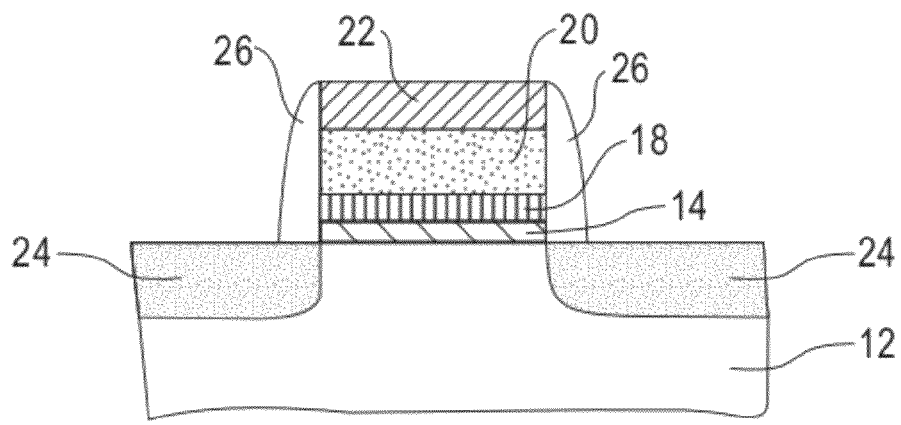

FIG. 2F shows the structure of FIG. 2E after spacer formation. That is, FIG. 2F shows the structure after at least one spacer 26 is formed on the exposed sidewall of the gate region 16. The at least one spacer 26 is formed utilizing a conventional deposition process, followed by etching. The at least one spacer 26 may be comprised of an oxide, a nitride and/or an oxynitride. Typically, oxides of silicon and/or nitrides of silicon are used as spacer materials.

Figure 2G:
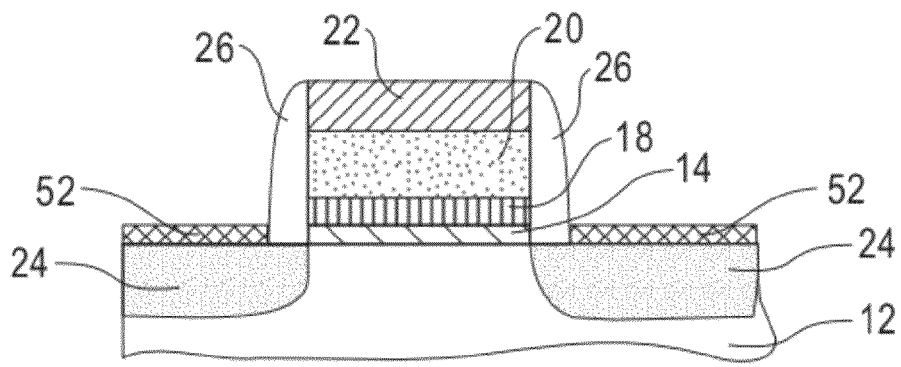

FIG. 2G illustrates the structure of FIG. 2F after forming a Si-containing or Ge-containing cap 52 on exposed surfaces of the III-V compound semiconductor 12. The Si-containing or Ge-containing cap 52 is formed utilizing an epitaxial growth process utilizing either a Si-containing precursor and/or a Ge-containing precursor. The conditions for the epitaxial growth include any that are well known to those skilled in the art for formation of a Si-containing or Ge-containing cap atop a semiconductor layer. By 'Si-containing cap", it is meant any cap layer that includes silicon. Examples of such Si-containing caps include Si (polycrystalline, or single crystalline), SiGe, and SiGeC, wherein the content of Si in the alloys is greater than the content of the other elements in the alloys. By 'Ge-containing cap", it is meant any cap layer that includes germanium. Examples of such Ge-containing caps include Ge (polycrystalline, or single crystalline), SiGe, and SiGeC, wherein the content of Ge in the alloys is greater than the content of the other elements in the alloys.

The thickness of the Si-containing or Ge-containing cap 52 may vary so long as it is thick enough to permit the formation of a metal semiconductor alloy, i.e., a metal silicide or metal germanide, without significantly consuming the underlying III-V compound semiconductor 12. Typically, the cap 52 has a thickness from 100 nm to 4000 nm, with a thickness from 2500 nm to 3800 nm being even more typical. After cap deposition, thermal activation is performed at a temperature of about 800° C. or higher, with an activation temperature of about 900° C. or higher being even more typical.

Figure 2H:
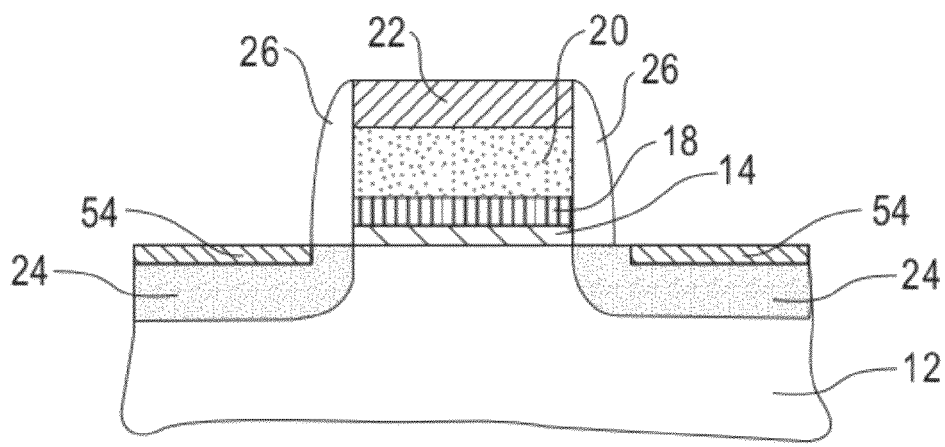

Next, a metal semiconductor alloy 54 is formed atop the source and drain regions 24 of the structure shown in FIG. 2G providing the structure shown in FIG. 2H. The metal semiconductor alloy 54 is formed utilizing a conventional salicidation and/or germanidation process. This includes forming a metal capable of reacting with the cap layer 52 atop the entire structure shown in FIG. 2G, forming a barrier layer atop the metal, heating the structure to form a metal semiconductor alloy, removing non-reacted metal and the barrier layer and, if needed, conducting a second heating step. The second heating step is required in those instances in which the first heating step does not form the lowest resistance phase of the metal semiconductor alloy. The metal used in forming the metal semiconductor alloy comprises one of Ti, Ni, Pt, W, Co, Ire, and the like. Alloying additives can also be present as desired. The barrier layer is typically comprised of TiN or TaN.

The heating, i.e., anneal, step used in forming the metal semiconductor alloy includes conditions that are well known to those skilled in the art. Typically, the first heating step is performed at a temperature from 700° C. to 900° C., with a temperature from 800° C. to 850° C. being even more typical (for TiSi$_2$). For NiSi formation, the first heating step is performed at temperature from 300° C. to 400° C. The second heating step, if performed, is typically performed at a temperature from 400° C. to 500° C., with a temperature from 450° C. to 500° C. being even more typical. In embodiments in which a hard mask is not present atop the gate conductor, the above steps may also form a metal semiconductor alloy on top of the gate conductor. In yet other embodiments, the above processing steps may completely remove the conductor gate and replace the same with a fully silicided gate conductor. Further CMOS processing including interconnect formation can be performed on the structure shown in FIG. 2H.

The following examples are provided to illustrate some aspects of the present invention.

Example 1 and Comparative Example 1

In this example, a structure including a 250 Å amorphous silicon layer formed atop a GaAs substrate (in accordance with this invention) was compared to a structure including a greater than 400 Å amorphous silicon layer formed a GaAs substrate (outside the invention). In each case, the structure was prepared by depositing an amorphous silicon film by e-beam evaporation onto a GaAs substrate and then subjecting the structure to annealing at 900° C. for 5 seconds. The amorphous silicon layer was then removed from each structure and the morphology of the surface of the GaAs substrate was examined by optical micrography.

Figure 3A:
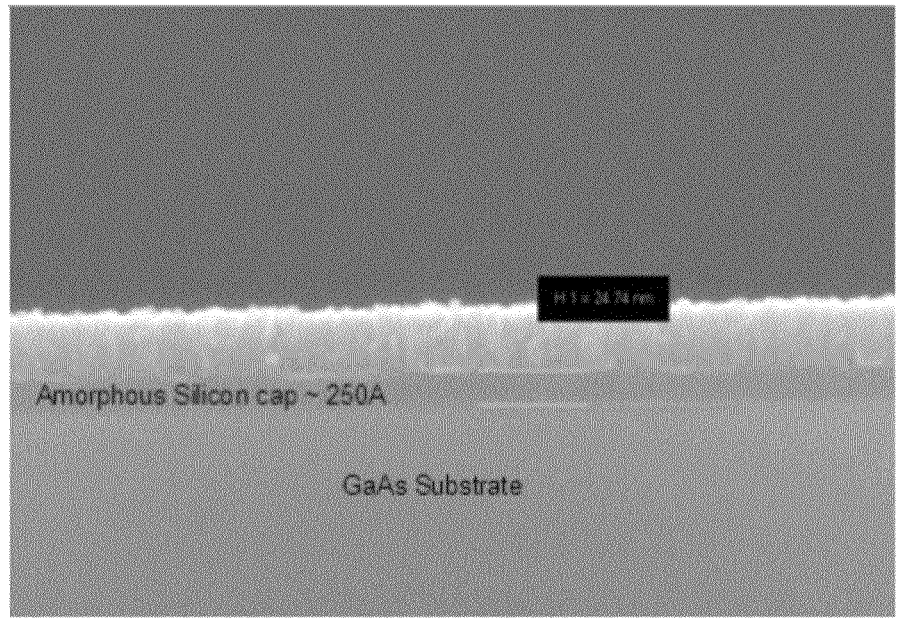
FIGS. 3A-3C are micrographs of a structure in accordance with the invention. Specifically.
Figure 3B:
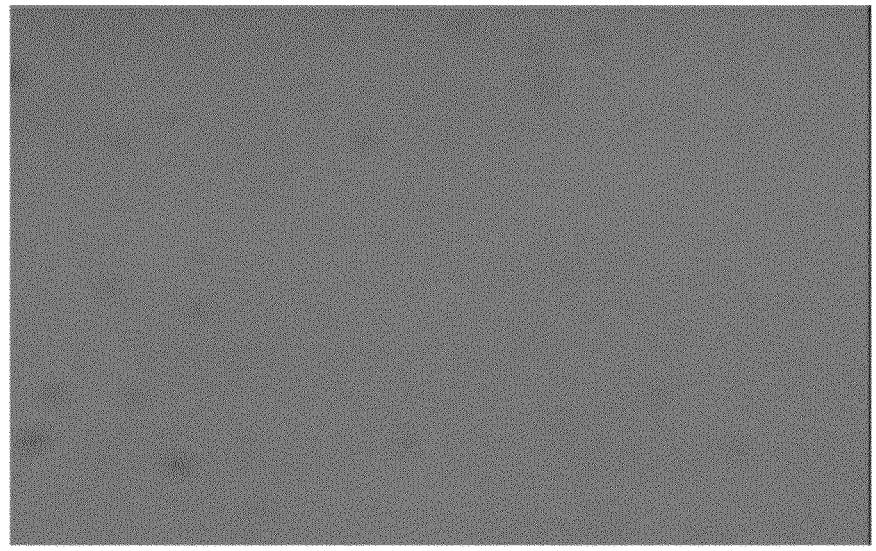
Figure 3C:
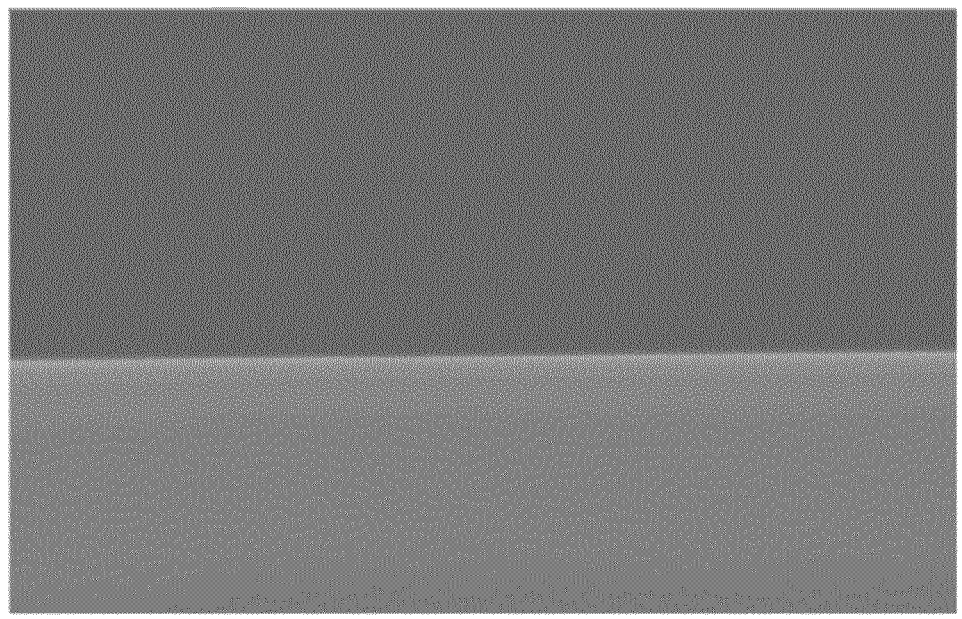

Reference is first made to FIGS. 3A-3C which are micrographs of a structure in accordance with the invention. Specifically, FIG. 3A is a cross sectional micrograph of a structure including a 250 Å amorphous silicon layer formed atop a GaAs substrate after thermal annealing, FIG. 3B is a top down view showing the surface of the amorphous Si on GaAs substrate of FIG. 3A, and FIG. 3C is the corresponding cross sectional view of the structure shown in FIG. 3B after removing the amorphous silicon layer. These micrographs clearly shown that a 250 Å amorphous silicon layer had sufficient thickness to serve as a cap/passivation layer for a GaAs separate since no evaporation of As and thus no surface pitting was observed.

Figure 4A:
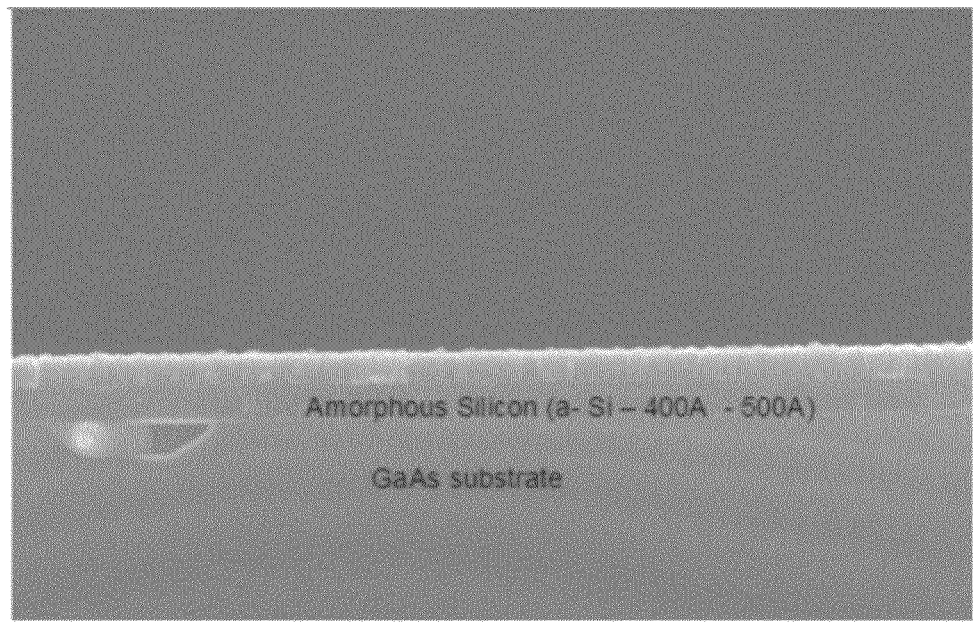
FIGS. 4A-4C are micrographs of a structure not in accordance with the invention. Specifically.
Figure 4B:
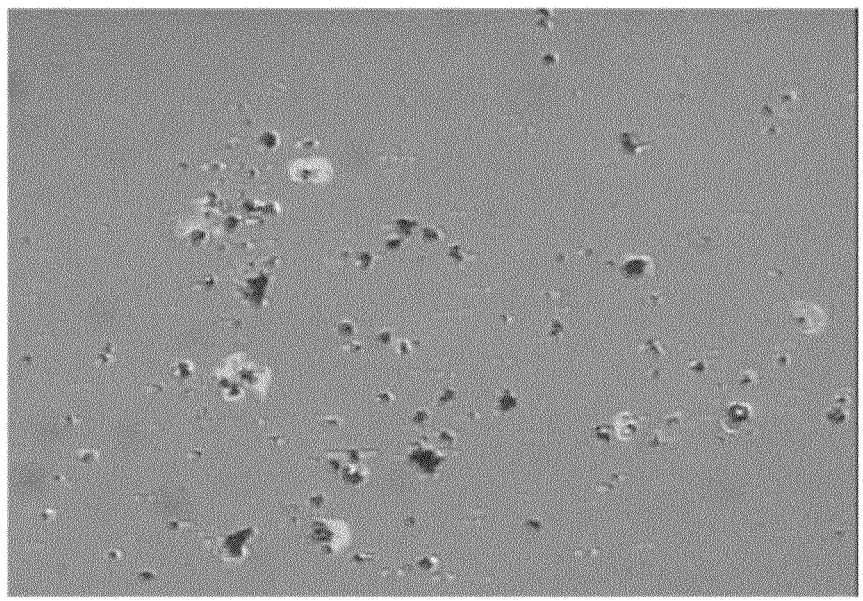
Figure 4C:
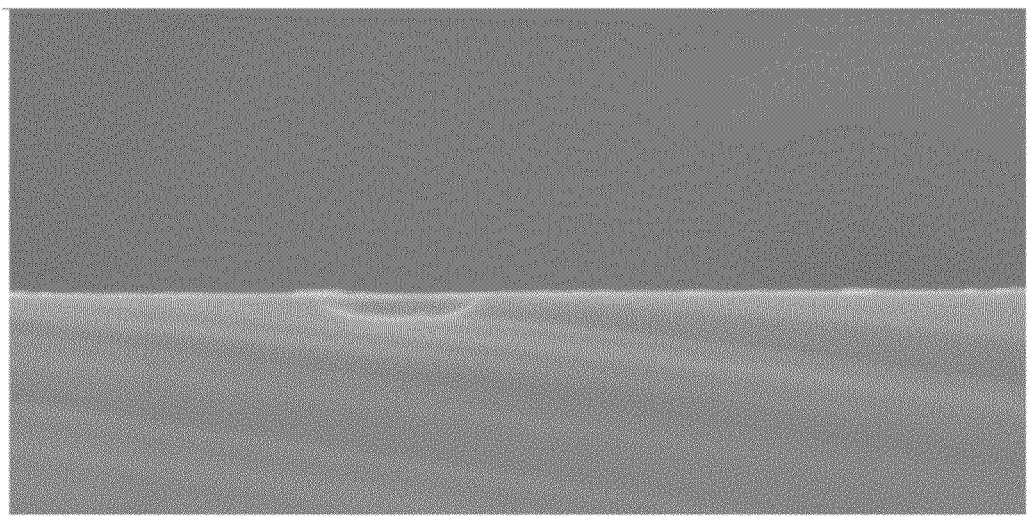

Reference is not made to FIGS. 4A-4C which are micrographs of a structure not in accordance with the invention. Specifically, FIG. 4A is a cross sectional micrograph of a structure including a greater than 400 Å amorphous silicon layer formed atop a GaAs substrate after thermal annealing, FIG. 4B is a corresponding top down view showing the surface of the amorphous Si cap on GaAs substrate of FIG. 4A, and FIG. 4C is the corresponding cross sectional view of the structure shown in FIG. 4B after removing the amorphous silicon layer. These micrographs clearly shown that a greater than 400 Å amorphous silicon layer does not serve as a cap/passivation layer for a GaAs separate since evaporation of As and thus surface pitting was observed.

Example 2 and Comparative Example 2

In this example, the structures mentioned above in Example 1 and Comparative Example 1 were subjected to secondary ion mass spectroscopy (SIMS) and atomic force microspectroscopy (AFM), respectively.

Specifically, the SIMS profile of Ga and As in a 250 Å amorphous silicon film on a GaAs substrate post annealing at 900° C. for 5 sec was determined. The overall concentration of Ga in the 250 Å amorphous silicon cap was found to be 2 $E^{14}/cm^2$. It is important to note that the Ga atom profile was flat throughout the 250 Å amorphous silicon cap. Arsenic (As) total concentration in the 250 Å amorphous silicon cap was also 2 $E^{14}/cm^2$, however, As concentration was very inhomogeneous throughout the cap and increases as it reached the surface.

The SIMS profile of Ga and As in a greater than 400 Å amorphous silicon film on GaAs after annealing 900° C. for 5 sec was also taken. The overall concentration of Ga in the greater than 400 Å amorphous silicon (α-Si) cap was found to be 8 $E^{14}/cm^2$, while the As concentration was 4 $E^{14}/cm^2$. The SIMS profile of Ga atoms of the comparative example still showed quite a flat profile throughout the greater than 400 Å α-Si cap as it was shown for the 250 Å α-Si cap. However, concentration of Ga atoms was increased in the greater than 400 Å α-Si cap to 8 $E^{14}/cm^2$ from 2 $E^{14}/cm^2$ in the 250 Å α-Si cap. Arsenic (As) concentration was increased by a factor of 2 to 4 $E^{14}/cm^2$ as compare to the 250 Å α-Si cap.

The above SIMS results provide some insight into a mechanism of achieving defect free interface between the 250 Å α-Si cap and GaAs substrate. As mentioned above, there was arsenic (As) and gallium (Ga) loss from the substrate from both thicknesses. However, the As and Ga tended to diffuse out of the 250 Å α-Si cap with very similar rates throughout the film. On the other hand, the greater than 400 Å α-Si cap did not allow complete diffusion of As and Ga atoms through the silicon cap probably leading to pressure build up and causing severe interface defects. It was also observed from the comparative example that the Ga atom concentration in the greater than 400 Å amorphous silicon cap was three times higher than the 250 Å α-Si cap, while As concentration in the greater than 400 Å α-Si cap was twice as high as the 250 Å amorphous silicon cap. The applicants also hypothesize that the 250 Å α-Si film on GaAs may have different stress properties than the greater than 400 Å amorphous silicon film on GaAs leading to different interfacial properties.

In summary, it was concluded in above the SIMS studies that the 250 Å amorphous silicon cap allows Ga and As to diffuse out of the surface, hence leaving a defect free α-Si/GaAs interface. On the other hand, the greater than 500 Å α-Si cap retards the diffusion of Ga and As through the cap, leading to severe defects and damages at the amorphous silicon GaAs interface.

In addition to SIMS, AFM was also performed on each structure. The Image Z range of 20 nm and image raw mean of 782 nm on annealed bare GaAs substrate previously containing a 400-500 Å amorphous silicon layer was measured. In addition, the image RMS was 1.4 nm. It was quite obvious from AFM images, that GaAs surface after 900° C. for 5 sec RTA is highly damaged. Surface morphology shows very rough GaAs surface with excessive damage and pitting due to As evaporation above 600° C. annealing. The AFM results confirmed that it was impossible to anneal GaAs substrate at high temperature for dopant activation or ion implantation damage recovery at high temperature and produce device grade quality GaAs surface.

The annealed amorphous silicon capped GaAs surfaces were also investigated using AFM to understand surface roughness and morphology of the amorphous silicon capped GaAs surfaces, the scan area for the AFM images for each structure was 1 micron×1 micron. The scan rate to collect AFM images was 1.001 Hz. Surface roughness of 900° C. for 5 sec RTA of the 250 Å amorphous silicon film was 7.103 nm and image root mean square was 0.4 nm. These results show that surface roughness of the 250 Å amorphous silicon cap on GaAs substrate had device quality grade surface morphology and this technique can be used for GaAs based device fabrication.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure in which surface pitting of III-V semiconductor compounds is prevented, said method comprising:
    forming a structure including a silicon layer having a thickness from 10 Å to 400 Å on an exposed surface of a III-V compound semiconductor; and
    subjecting the structure to an annealing process at a temperature of about 800° C. or greater, wherein surface pitting of the III-V compound semiconductor is limited to provide a surface roughness that is less than 250 nm and a root mean square roughness of less than 0.5 nm.

2. The method of claim 1 wherein said thickness of said silicon layer is from 50 Å to 390 Å.

3. The method of claim 2 wherein said thickness of said silicon layer is from 70 Å to 380 Å.

4. The method of claim 3 wherein said thickness of said silicon layer is from 150 Å to 275 Å.

5. The method of claim 1 wherein said III-V compound semiconductor includes at least one element from Group III of the Periodic Table of Elements and at least one element from Group V of the Periodic Table of Elements.

6. The method of claim 5 wherein said III-V compound semiconductor is GaAs.

7. The method of claim 1 wherein said silicon layer is formed by plasma enhanced chemical vapor deposition, chemical vapor deposition, atomic layer deposition, e-beam evaporation or sputtering.

8. The method of claim 1 further comprising forming a gate region including at least a high k dielectric and an overlying gate conductor upon a portion of the silicon layer prior to said annealing, and said annealing forms activated source and drain regions within the III-V compound semiconductor at the footprint of the gate region.

9. The method of claim 8 wherein said annealing follows an ion implantation process.

10. The method of claim 9 further comprising forming at least one spacer on an exposed sidewall of the gate region and atop a portion of the silicon layer.

11. The method of claim 10 further comprising selectively removing portions of the silicon layer that are not beneath either the at least one spacer or the gate region.

12. The method of claim 1 wherein a gate region including a protected photoresist mask is formed atop a portion of the silicon layer prior to said annealing, said gate region further including a high k dielectric and an overlying gate conductor.

13. The method of claim 12 wherein exposed portions of the silicon layer are selectively removed and thereafter the implantation of source/drain dopants within exposed portions of the III-V compound semiconductor is performed.

14. The method of claim 13 wherein after silicon layer formation and annealing the implanted source/drain dopants a metal semiconductor alloy layer is formed atop exposed source and drain regions.

15. The method of claim 14 wherein the metal semiconductor alloy formation includes first removing the patterned photoresist mask and then performing a salicidation or germanidation process, said salicidation or germanidation process includes forming either a Si-containing cap or a Ge-containing atop the source and drain regions, forming a metal semiconductor alloy forming metal on at least said Si-containing or Ge-containing cap, and thereafter performing another anneal step.

16. The method of claim 1 wherein said silicon layer is polycrystalline.

17. The method of claim 1 wherein said silicon layer is amorphous.

18. The method of claim 1 wherein said silicon layer is single crystalline.

19. The method of claim 1 wherein said surface roughness is less than 240 nm and said root mean square roughness is 0.4 nm or less.

20. The method of claim 1 wherein said III-V compound semiconductor is single crystalline.

\* \* \* \* \*